(12) United States Patent
Saitoh

(10) Patent No.: US 6,291,775 B1
(45) Date of Patent: Sep. 18, 2001

(54) FLIP CHIP BONDING LAND WAVING PREVENTION PATTERN

(75) Inventor: Tohru Saitoh, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/291,314

(22) Filed: Apr. 14, 1999

(30) Foreign Application Priority Data

Apr. 21, 1998 (JP) .................................................. 10-125390

(51) Int. Cl.$^7$ ................................ H05K 1/03; H05K 1/09
(52) U.S. Cl. ........................ 174/250; 174/255; 361/777; 361/780; 257/786
(58) Field of Search ..................... 361/748–751, 361/767, 768, 777, 778, 780, 794; 174/250, 253, 255, 261; 257/778, 786; 438/108, 125

(56) References Cited

U.S. PATENT DOCUMENTS

| | | | |
|---|---|---|---|
| 4,742,431 | * 5/1988 | Igarashi | 361/749 |
| 5,677,575 | * 10/1997 | Maeta et al. | 257/778 |
| 5,773,882 | * 6/1998 | Iwasaki | 257/778 |
| 5,834,848 | * 11/1998 | Iwasaki | 257/778 |
| 5,900,312 | * 5/1999 | Sylvester | 174/255 |
| 5,912,654 | * 6/1999 | Ouchi et al. | 361/748 |
| 6,054,774 | * 4/2000 | Ohmori et al. | 257/786 |

FOREIGN PATENT DOCUMENTS

| | | |
|---|---|---|
| 0 682 369 | 4/1995 | (EP) . |
| 0 735 807 | 3/1996 | (EP) . |
| 02-143583 A | * 6/1990 | (JP) . |
| 06-090068 A | * 3/1994 | (JP) . |
| 8-64927 | 3/1996 | (JP) . |
| 9-223715 | 8/1997 | (JP) . |
| 10-013003 A | * 1/1998 | (JP) . |

OTHER PUBLICATIONS

Patent Abstracts of Japan: Printed Wiring Board. Publ. #06090068, Mar. 1994.
Patent Abstracts of Japan: Electrical Connection Structure and Liquid Crystal Device. Publ. #09121078, May 1997.
Patent Abstracts of Japan: Semiconductor Device. Publ. #10013003, Jan. 1998.
Patent Abstracts of Japan: Mounting Method of Semiconductor Chip. Publ. #08064927, Mar. 1996.

* cited by examiner

Primary Examiner—Jeffrey Gaffin
Assistant Examiner—John B. Vigushin
(74) Attorney, Agent, or Firm—Pearne & Gordon LLP

(57) ABSTRACT

Lands (1) for bonding a flip chip (3) are provided in a surface layer of a printed board (5). A dummy pattern or ground pattern (2) for preventing waving is provided on a layer next to the surface layer. The interlaminar thickness is made uniform by the dummy pattern or ground pattern (2). Since the flip chip bonding lands are arranged substantially in a plane, the flip chip lands are supported by the dummy or ground pattern to prevent waving from occurring so that high bonding quality can be obtained. In contrast to an arrangement in which a dummy pattern is not provided partially in a portion where bonding becomes unstable, a dummy pattern or a ground pattern is provided in an area corresponding to the outer shape of a flip chip to thereby support all the bonding lands of the flip chip. The flip chip bonding lands are kept in a uniform plane to suppress waving of the printed board so that bonding can be effected surely.

8 Claims, 10 Drawing Sheets

FLIP CHIP BONDING LAND WAVING PREVENTION PATTERN

BACKGROUND OF THE INVENTION

The present invention relates to a flip chip bonding land waving prevention pattern, which is, in particularly, provided on a layer next to flip chip bonding lands in a printed board in order to mount a flip chip surely.

Recently, as miniaturization of semiconductor chips has been advanced with the progress of semiconductor elements, most elements are not only small in size but also large in number of their terminals. Along with the advancement, when flip chips (bare chips) are mounted, they are often turned upside down so that electrodes come down. That is, the flip chips are face-down mounted. As a practical structure of the face-down mounting of a flip chip, there is generally adopted a structure in which a foot print is provided in a printed board correspondingly to bumps of the flip chip, and face-down mounting is performed between the bumps and the foot print. As for the method of mounting a semiconductor chip, bumps are bonded onto a plurality of electrodes of the semiconductor chip one by one by a capillary of a bonding device, and the semiconductor chip is pressed onto a glass substrate so as to level the height of the bumps.

On the other hand, pads corresponding to the electrodes of the semiconductor chip are formed by photolithography on a mounting surface of an FPC (Flexible Printed Circuitboard), and an thermosetting and insulating bonding agent is applied to the pads by screen printing. Then, the pads of the FPC and the bumps of the semiconductor chip are positioned on a bonding stage of the bonding device, and the semiconductor chip is pressed and heated by a bonding head so as to connect the pads with the bumps electrically, and so as to harden the thermosetting and insulating bonding agent, at the same time, to fix the semiconductor chip onto the FPC.

However, in such a face-down mounting structure of a flip chip, the pads and the bumps are connected with each other surely if the thickness of the FPC is uniform and the flatness among the pads is superior. But, if there is no pattern on a layer adjacent to and directly below the foot print, portions having a signal pattern 4 and portions having no signal pattern 4 are mixed as shown in FIG. 10, so that interlaminar thickness cannot be made uniform. In the portions having no signal pattern 4, flip bonding lands 1 become wavy so that they cannot be connected. Therefore, it has been proposed to provide a dummy pattern to make the flip bonding lands flat.

For example, in a structure for face-down mounting bumps of a flip chip on a printed-wiring board, as disclosed in JP-A-9-223715, a dummy pattern is provided in a position corresponding to the bumps of the flip chip and in a place having no pattern on a layer adjacent to and directly below a foot print. Sinking-down to the foot print side and/or scattering in deformation due to pressing and heating for melting and hardening a connection medium is hardly caused at the time of mounting so that the interlaminar board thickness is made uniform. Alternatively, a dummy pattern is disposed in all the positions corresponding to the bumps on a layer adjacent to and directly blow the foot print, or a dummy pattern is formed into a single-plane pattern corresponding to a plurality of foot prints and connected to a power supply or the ground.

On the other hand, in a method of mounting a semiconductor chip, as disclosed in JP-A-8-64927, a dummy pattern for compensating ununiformity in board thickness is formed before execution of a bonding process between pads of a circuit board and bumps of a semiconductor chip. When the dummy pattern for compensating ununiformity in board thickness is formed, the flatness among the pads of the circuit board is improved because the thickness of the circuit board can be made substantially uniform. Therefore, electric connection is accurately performed by the displacement of the bumps caused by pressing and heating when the semiconductor chip is mounted.

According to the background art, a dummy pattern was provided partially or all over the surface of a printed board. That is, since the dummy pattern was provided independently of the shape of a flip-chip, it was difficult to make uniform the thickness of the board in an area corresponding to the shape of the flip chip. Accordingly, it was impossible to satisfactorily prevent lands from waving.

SUMMARY OF THE INVENTION

The present invention is to solve the foregoing problem, and an object thereof is to prevent lands of a resin printed board from waving to make the flip chip bonding lands on the circuit board flat to thereby realize highly reliable connection between the flip chip and the lands.

In order to attain the foregoing object, according to the present invention, a flip chip bonding land waving prevention pattern is configured in such a manner that a dummy or ground pattern, or a signal pattern is provided on a layer next to flip chip bonding lands in a printed board as a waving prevention pattern for making the chip bonding lands substantially flat, so that the waving prevention pattern supports all the flip chip bonding lands.

In contrast to a structure in which no dummy pattern is provided partially in a portion that is unstable in bonding, a dummy or ground pattern according to the present invention is provided in an area corresponding to the outer shape of a flip chip so as to support all the lands for bonding the flip chip. Therefore, it is possible to prevent waving of the lands of the resin printed board, and realize highly reliable connection.

In a first aspect of the invention, the flip chip bonding land waving prevention pattern is characterized in that a pattern for supporting all of flip chip bonding lands of a printed board so as to arrange the lands in a plane is provided in an area corresponding to an outer shape of a flip chip on a layer next to the flip chip bonding lands. Thus, the pattern has a function to make the lands of the resin printed board flat correspondingly to the outer shape of the flip chip to thereby realize highly reliable connection.

In a second aspect of the invention, the flip chip bonding land waving prevention pattern is characterized in that a pattern for supporting all of flip chip bonding lands of a printed board so as to arrange the lands in a plane is provided in an area of predetermined width where the flip chip bonding lands exist within an area corresponding to the outer shape of a flip chip on a layer next to the flip chip bonding lands. Thus, the pattern has a function to make the lands of the resin printed board flat correspondingly to the area of the width of the bonding lands to thereby realize highly reliable connection.

In a third aspect of the invention, the flip chip bonding land waving prevention pattern is characterized in that a pattern for supporting all of flip chip bonding lands of a printed board so as to arrange the lands in a plane is provided in positions corresponding to the flip chip bonding lands in an area of predetermined width where the flip chip bonding lands exist within an area corresponding to the outer shape of a flip chip on a layer next to said flip chip bonding lands. Thus, the pattern has a function to make the lands of the resin printed board flat correspondingly to the position of the bonding lands to thereby realize highly reliable connection.

In a fourth aspect of the invention, the flip chip bonding land waving prevention pattern is characterized in that a support pattern for supporting all of flip chip bonding lands of a printed board so as to arrange the lands in a plane is provided in area corresponding to the outer shape of a flip chip on a layer next to the flip chip bonding lands, and in that a signal pattern in the area is separated from the support pattern by a shape in the form of an extension of a width between the bonding lands of the flip chip. Thus, the pattern has a function to make the lands of the resin printed board flat by the support pattern and the signal pattern to thereby realize highly reliable connection.

In a fifth aspect of the invention, the flip chip bonding land waving prevention pattern is characterized in that a support pattern for supporting all of flip chip bonding lands of a printed board so as to arrange the lands in a plane is provided in an area of predetermined width where the flip chip bonding lands exist within an area corresponding to the outer shape of a flip chip on a layer next to the flip chip bonding lands, and in that a signal pattern in the area is separated from the support pattern by a width between the bonding lands of the flip chip. Thus, the pattern has a function to make the lands of the resin printed board flat by the support pattern and the signal pattern to thereby realize highly reliable connection.

In a sixth aspect of the invention, the flip chip bonding land waving prevention pattern is characterized in that a pattern for supporting all of flip chip bonding lands of a printed board so as to arrange the lands in a plane is provided in positions having no signal patterns of positions corresponding to the flip chip bonding lands in an area of predetermined width where the flip chip bonding lands exist within an area corresponding to the outer shape of a flip chip on a layer next to the flip chip bonding lands. Thus, the pattern has a function to make the lands of the resin printed board flat by the support pattern and the signal pattern to thereby realize highly reliable connection.

The present disclosure relates to the subject matter contained in Japanese patent application No. Hei. 10-125390 (filed on Apr. 21, 1998), which is expressly incorporated herein by reference in its entirety.

DESCRIPTION OF THE PREFERRED EMBODIMENT

Embodiments of the present invention will be described below in detail with reference to FIGS. 1 to 9.

First Embodiment

A first embodiment of the present invention is a flip chip bonding land waving prevention pattern in which a dummy pattern or a ground pattern is provided in an area corresponding to the outer shape of a flip chip to support all of flip chip bonding lands of a printed board in order to prevent the lands from waving.

Figure 1:
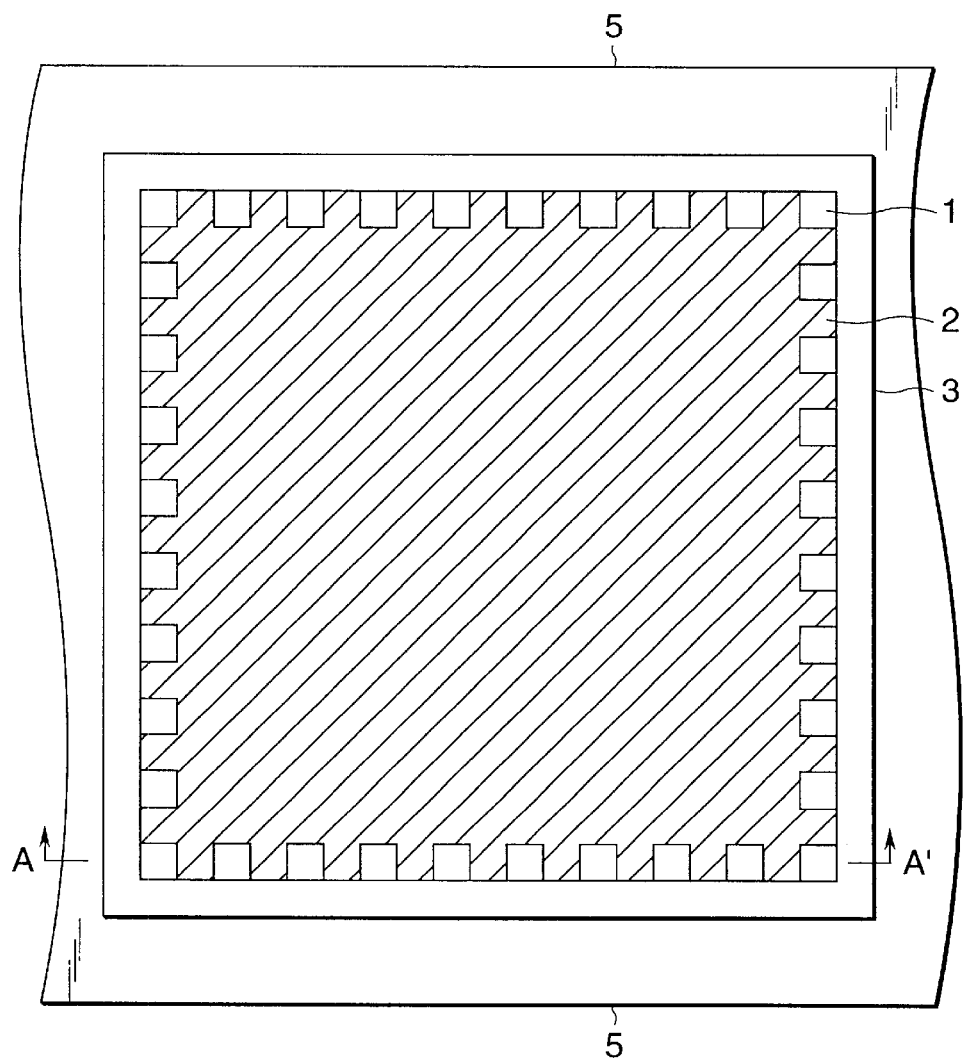
FIG. 1 is a plan view of a flip chip bonding land waving prevention pattern according to a first embodiment of the present invention.
Figure 2:
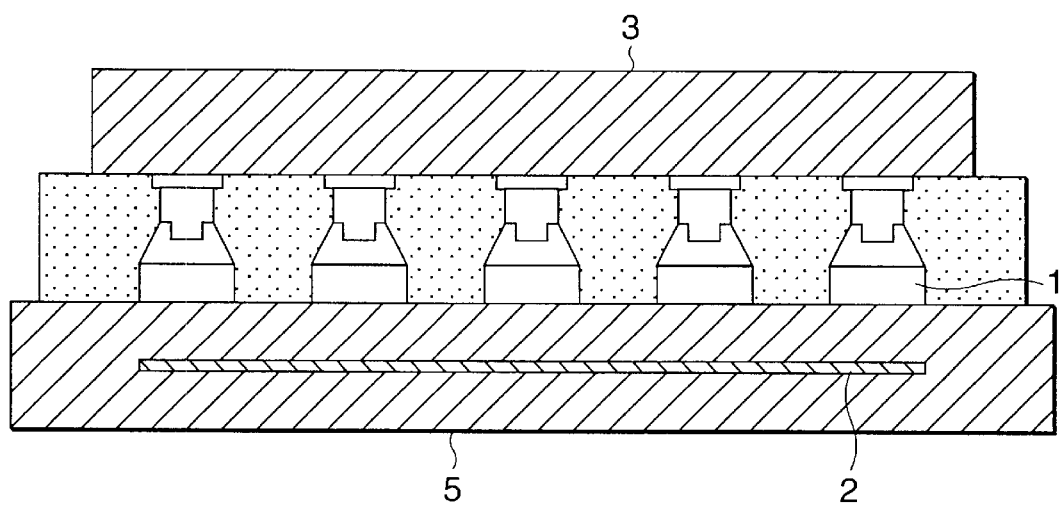
FIG. 2 is a sectional view of the flip chip bonding land waving prevention pattern according to the first embodiment of the present invention.

FIGS. 1 and 2 are diagrams showing a configuration of a flip chip bonding land waving prevention pattern according to the first embodiment of the present invention. In FIGS. 1 and 2, flip chip bonding lands 1 are provided for bonding a flip chip. In order to support these flip chip bonding lands 1, a dummy or ground pattern 2 is provided in the next layer.

FIG. 1 is a plan view showing a printed board 5 on which a flip chip 3 is bonded thereon. For the sake of convenience for explanation, the size of the flip chip 3 is shown by only a frame, and the dimensional relationship between the flip chip bonding lands 1 and the dummy or ground pattern 2 that is illustrated by the shadowed portion is shown by the schematic drawing. FIG. 1 shows an example in which the dummy or ground pattern 2 having substantially the same size as the rectangular outer size of the flip chip 3 is provided on a printed board 5. Although the size of the dummy or ground pattern 2 may be made quite the same as the rectangular outer size of the flip chip 3, the former is made equal to, in this embodiment, the rectangular area where the flip chip bonding lands 1 are formed.

FIG. 2 is a sectional view taken on line A–A', of the flip chip bonding land waving prevention pattern. Since the dummy or ground pattern 2 having substantially the same size as the rectangular outer size of the flip chip 3 is provided on the printed board 5, the flip chip bonding lands 1 keep a uniform plane, and there is no waving in the printed board. Accordingly, bonding is performed surely.

As described above, according to the first embodiment of the present invention, a flip chip bonding land waving prevention pattern is configured such that a dummy pattern or a ground pattern is provided in an area corresponding to the outer shape of a flip chip to support all of flip chip bonding lands. Accordingly, there is no waving in the printed board, and bonding becomes sure.

Second Embodiment

A second embodiment of the present invention is a flip chip bonding land waving prevention pattern in which a dummy pattern or a ground pattern is provided in an area of predetermined width where the flip chip bonding lands exist within an area corresponding to the outer shape of an flip chip to support all of flip chip bonding lands of a printed board in order to prevent the lands from waving.

Figure 3:
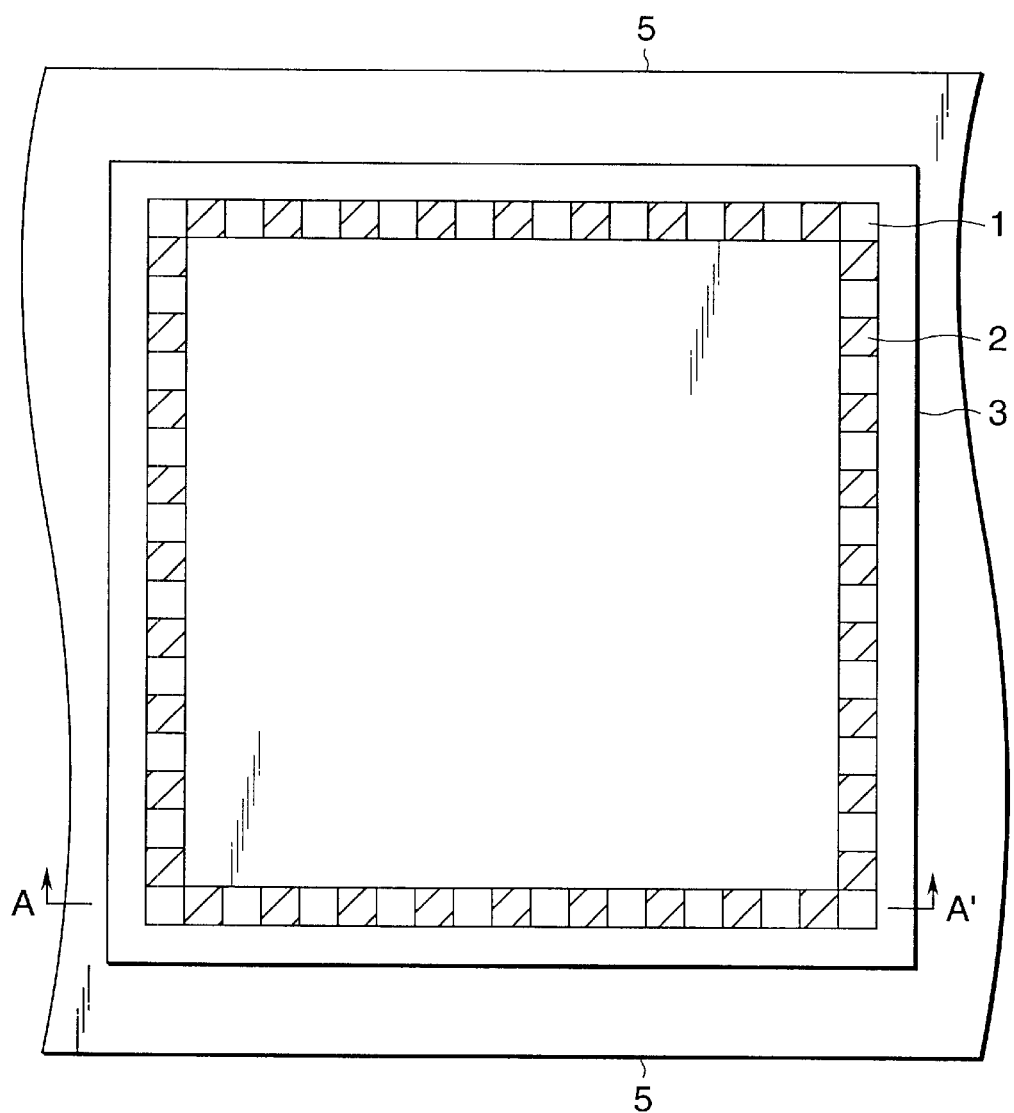
FIG. 3 is a plan view of a flip chip bonding land waving prevention pattern according to a second embodiment of the present invention.
Figure 4:
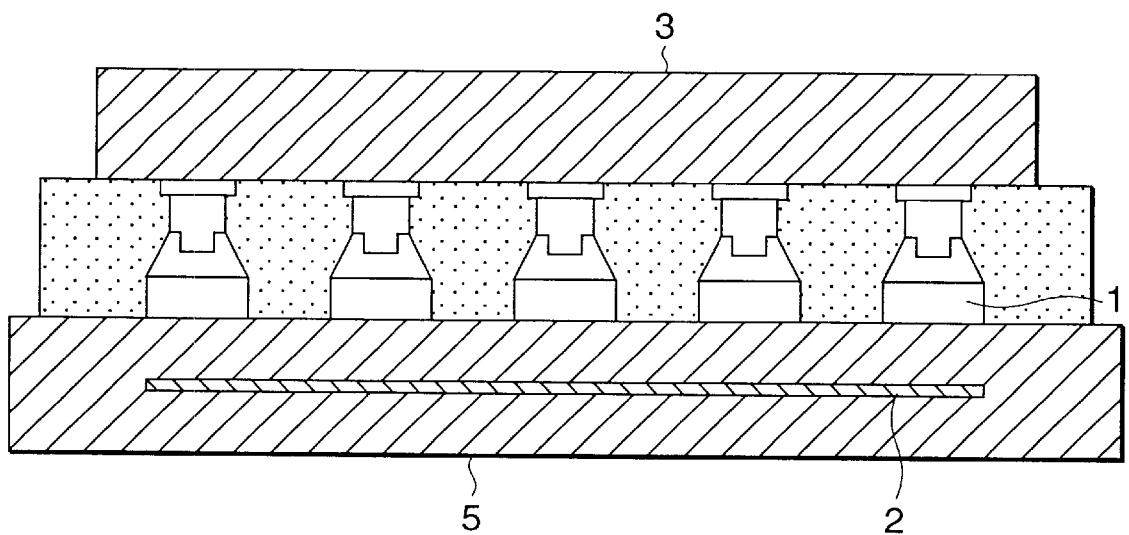
FIG. 4 is a sectional view of the flip chip bonding land waving prevention pattern according to the second embodiment of the present invention.

FIGS. 3 and 4 are diagrams showing a configuration of a flip chip bonding land waving prevention pattern according to the second embodiment of the present invention. In FIGS. 3 and 4, flip chip bonding lands 1 are provided for bonding a flip chip 3. In order to support these flip chip bonding lands 1, a dummy or ground pattern 2 is provided in the next layer.

FIG. 3 is a plan view showing a printed board 5 on which a flip chip 3 is bonded thereon. For the sake of convenience for explanation, the size of the flip chip 3 is shown by only a frame, and the dimensional relationship between the flip chip bonding lands 1 and the dummy or ground pattern 2 illustrated by the shadowed portion is shown by the schematic drawing. The size of the dummy or ground pattern 2 is arranged such that the dummy or ground pattern 2 is provided in the rectangular area in which the flip chip bonding lands 1 are formed, but from which the inner area surrounded by the flip chip bonding lands 1 is removed. In other words, the dummy or ground pattern 2 is provided in a hollow rectangular area drawn with a width corresponding to that of the flip chip bonding lands 1.

FIG. 4 is a sectional view taken on line A–A', of the flip chip bonding land waving prevention pattern. Since the dummy or ground pattern 2 having substantially the same size as the rectangular outer size of the flip chip 3 is provided on the printed board 5, the flip chip bonding lands 1 keep a uniform plane, and there is no waving in the printed board 5. Accordingly, bonding is performed surely.

As described above, according to the second embodiment of the present invention, a flip chip bonding land waving prevention pattern is configured such that at least a dummy pattern or a ground pattern is provided in an area of predetermined width where the flip chip bonding lands exist within an area corresponding to the outer shape of an flip chip to support all of flip chip bonding lands. Accordingly, there is no waving in the printed board, and bonding becomes sure.

Third Embodiment

A third embodiment of the present invention is a flip chip bonding land waving prevention pattern in which a dummy pattern or a ground pattern is provided in a corresponding position on a layer next to the bonding lands of a flip chip to support all of flip chip bonding lands of a printed board in order to prevent the lands from waving.

Figure 5:
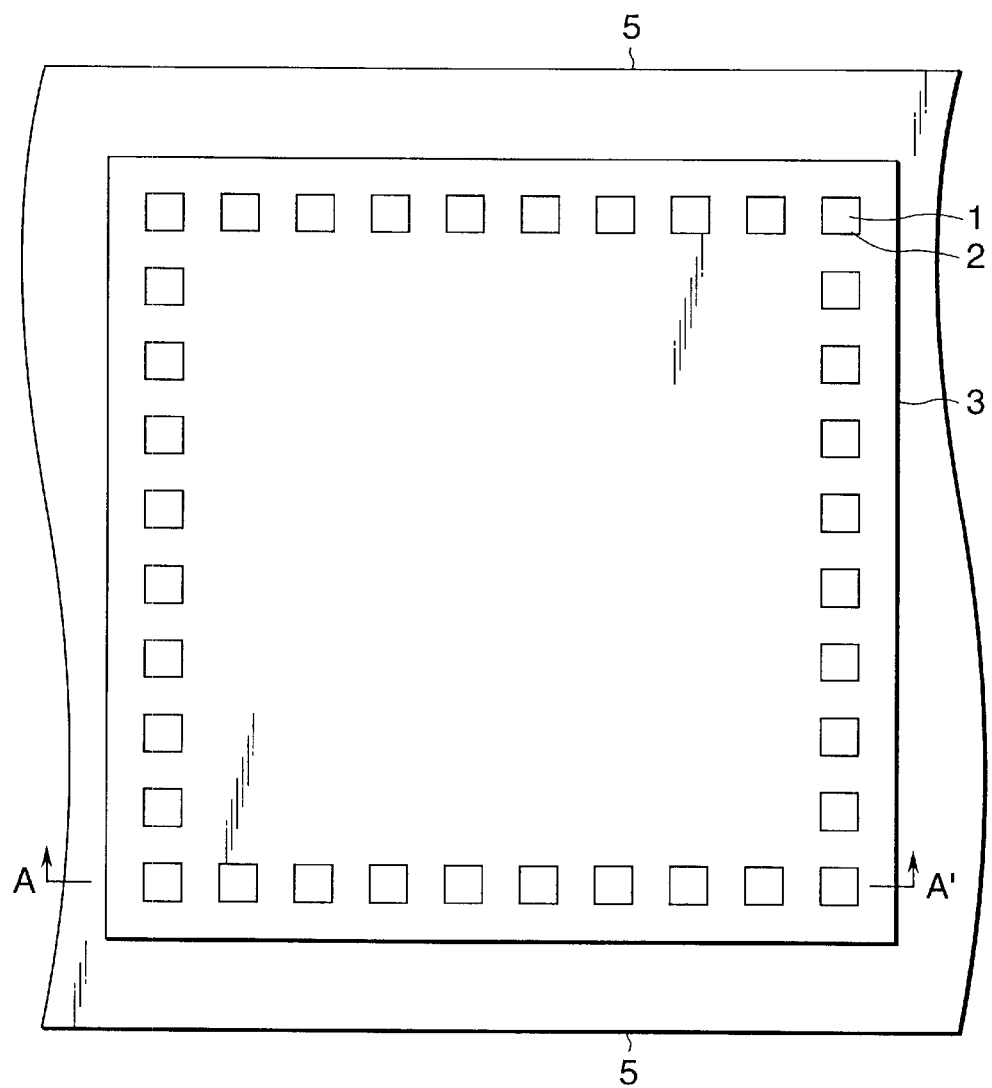
FIG. 5 is a plan view of a flip chip bonding land waving prevention pattern according to a third embodiment of the present invention.
Figure 6:
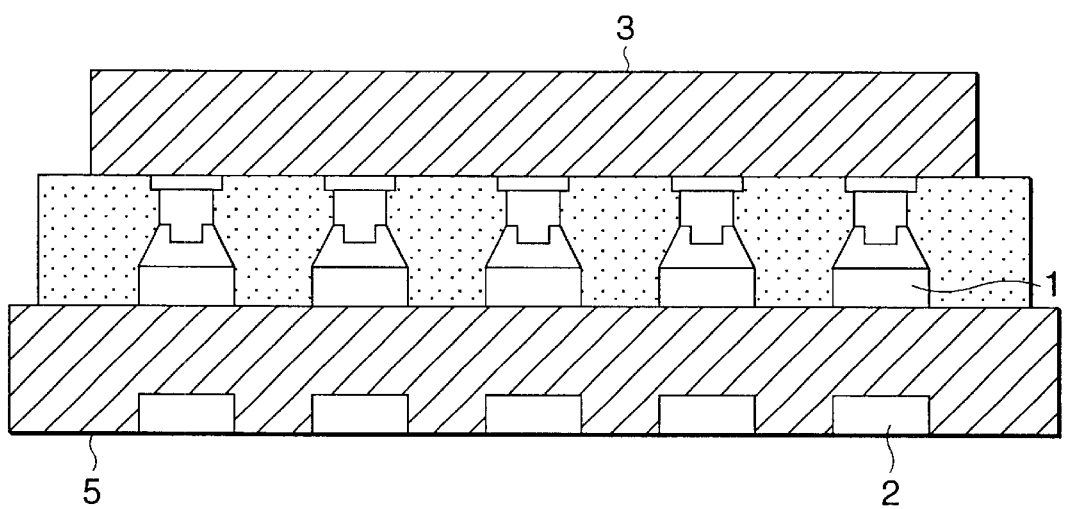
FIG. 6 is a sectional view of the flip chip bonding land waving prevention pattern according to the third embodiment of the present invention.

FIGS. 5 and 6 are diagrams showing a configuration of a flip chip bonding land waving prevention pattern according to the third embodiment of the present invention. In FIGS. 5 and 6, flip chip bonding lands 1 are provided for bonding a flip chip 3. In order to support these flip chip bonding lands 1, a dummy or ground pattern 2 is provided in the next layer.

FIG. 5 is a plan view showing a printed board 5 on which a flip chip 3 is bonded thereon. For the sake of convenience for explanation, the size of the flip chip 3 is shown by only a frame, and the dimensional relationship between the flip chip bonding lands 1 and the dummy or ground pattern 2 is shown by the schematic drawing. The size of the dummy pattern or ground pattern 2 is set such that the dummy or ground pattern 2 is provided within the rectangular area in which the flip chip bonding lands 1 are formed, and in the individual areas which make one-to-one correspondence to the flip chip bonding lands 1. Herein, the flip chip bonding lands 1 and the dummy or ground pattern 2 are illustrated on top of each other.

FIG. 6 is a sectional view taken on line A–A', of the flip chip bonding land waving prevention pattern. Since the dummy or ground pattern 2 having substantially the same size as the rectangular outer size of the flip chip 3 is provided on the printed board 5, the flip chip bonding lands 1 keep a uniform plane, and there is no waving in the printed board 5. Accordingly, bonding is performed surely.

As described above, according to the third embodiment of the present invention, a flip chip bonding land waving prevention pattern is configured such that a dummy pattern or a ground pattern is provided in a position corresponding to the bonding lands of a flip chip to support all of flip chip bonding lands. Accordingly, there is no waving in the printed board, and bonding becomes sure.

Forth Embodiment

A fourth embodiment of the present invention is a flip chip bonding land waving prevention pattern in which a dummy pattern or a ground pattern is provided in an area corresponding to the outer shape of a flip chip to support all of flip chip bonding lands of a printed board, while a signal pattern in the area and the dummy pattern are separated from each other, in order to prevent the lands from waving.

Figure 7:
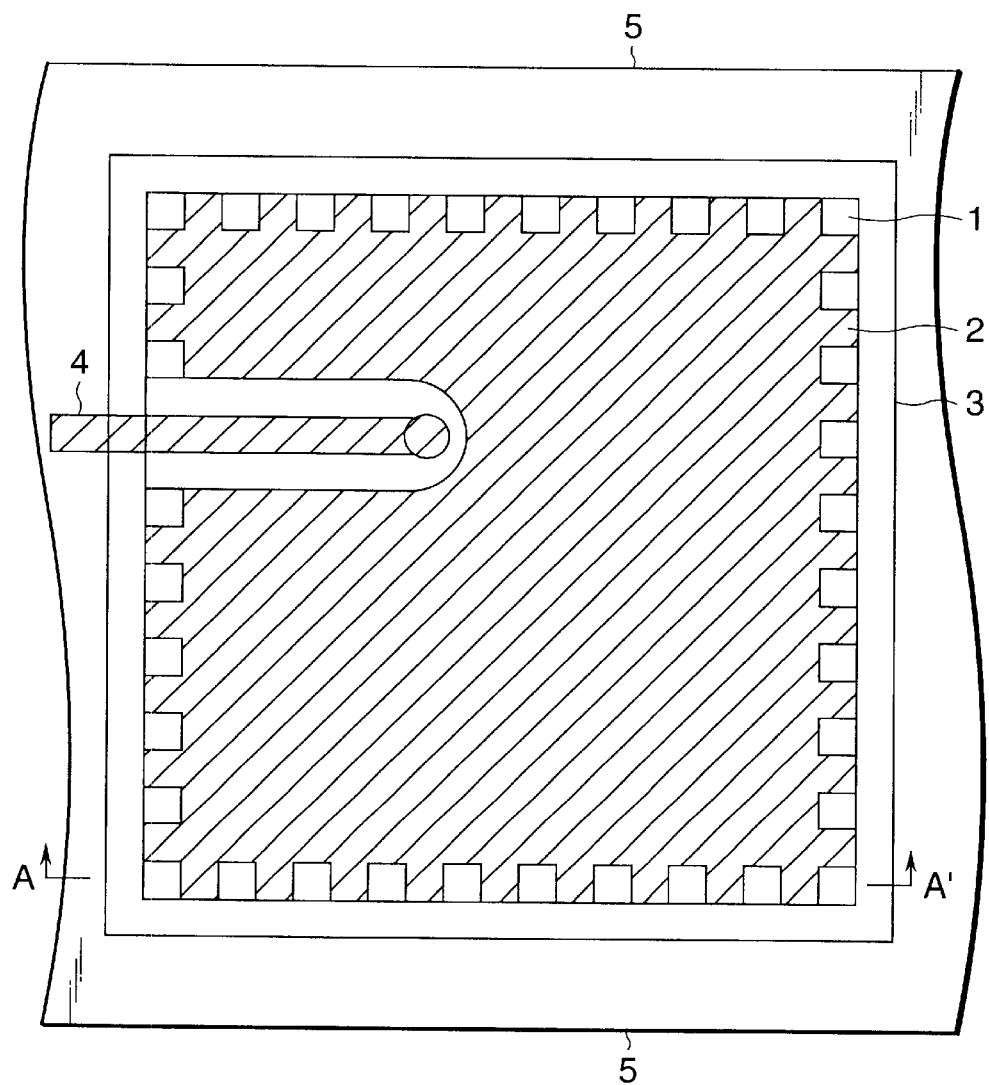
FIG. 7 is a plan view of a flip chip bonding land waving prevention pattern according to a fourth embodiment of the present invention.

FIG. 7 is a plan view showing a configuration of a flip chip bonding land waving prevention pattern according to a fourth embodiment of the present invention. On occasion, a signal pattern 4 may be provided in the area of a dummy or ground pattern 2 in accordance with the pattern design of a product. In such a case, the dummy or ground pattern 2 is cut, and the lands 1 are supported by the signal pattern 4.

FIG. 7 shows an example in which the dummy or ground pattern 2 having substantially the same size as the rectangular outer size of the flip chip 3 is provided on a printed board 5.

The example shows a case where the signal pattern 4 exists in the area of the dummy or ground pattern 2. The area of the dummy or ground pattern 2 is separated from the signal pattern 4 at a predetermined distance. In this example, the distance between the flip chip bonding lands 1 and the signal pattern 4 is fixed, and the dummy pattern 2 is cut in a U-shape surrounding the signal pattern 4. Also in this example, in the view from the sectional direction, the dummy or ground pattern 2 having substantially the same size, as a whole, as the rectangular outer shape of the flip chip 3 is provided on the printed board 5. Accordingly, the flip chip bonding lands 1 keep a uniform plane, and there is no waving in the printed board. Accordingly, bonding is performed surely.

As described above, according to the fourth embodiment of the present invention, a flip chip bonding land waving prevention pattern is configured such that a dummy pattern or a ground pattern is provided in an area corresponding to the outer shape of a flip chip, while a signal pattern in the area and the dummy pattern are separated from each other, in order to support all of flip chip bonding lands. Accordingly, there is no waving in the printed board, and bonding becomes sure.

Fifth Embodiment

A fifth embodiment of the present invention is a flip chip bonding land waving prevention pattern in which a dummy pattern or a ground pattern is provided in an area of predetermined width where the flip chip bonding lands exist, while a signal pattern in the area is separated from the dummy pattern, to support all of flip chip bonding lands.

Figure 8:
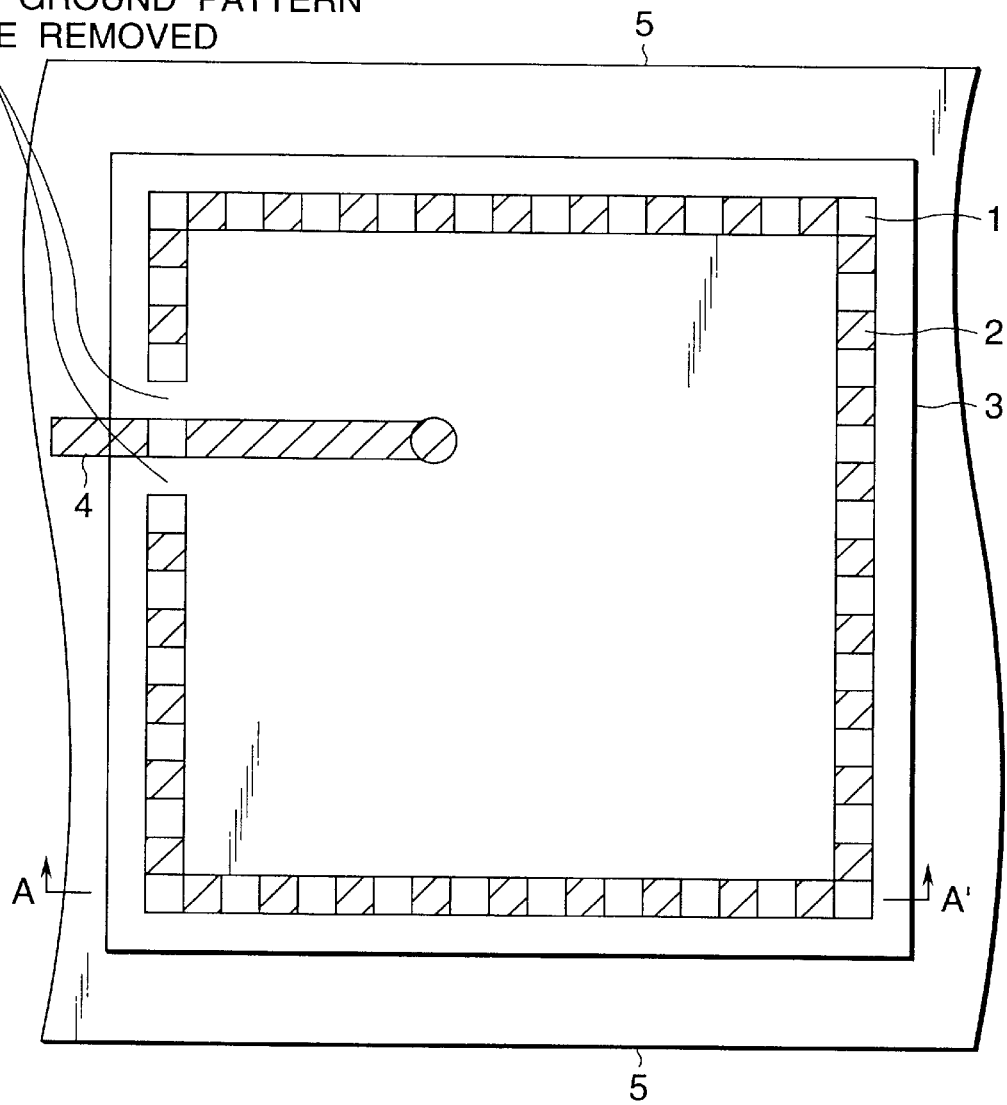
FIG. 8 is a plan view of a flip chip bonding land waving prevention pattern according to a fifth embodiment of the present invention.

FIG. 8 shows a configuration of a flip chip bonding land waving prevention pattern according to a fifth embodiment of the present invention. FIG. 8 shows an example in which the dummy or ground pattern 2 having substantially the same size as the rectangular outer size of the flip chip 3 is provided on a printed board 5. In this example, the size of the dummy or ground pattern 2 is arranged such that the dummy or ground pattern 2 is provided in the rectangular area in which the flip chip bonding lands 1 are formed, but from which the inner area surrounded by the flip chip bonding lands 1 is removed. In other words, the dummy or ground pattern 2 is provided in a hollow rectangular area drawn with a width corresponding to that of the flip chip bonding lands 1. The example shows a case where a part of the signal pattern 4 enters the inside of the area of the dummy or ground pattern 2. Herein, the area of the dummy or ground pattern 2 is separated from the signal pattern 4 at a predetermined distance on each of the opposite sides of the signal pattern 4. Also in this example, in the view from the sectional direction, the dummy or ground pattern 2 having substantially the same size, as a whole, as the rectangular outer shape of the flip chip 3 is provided on the printed board 5. Accordingly, the flip chip bonding lands 1 keep a uniform plane, and there is no waving in the printed board. Accordingly, bonding is performed surely.

As described above, according to the fifth embodiment of the present invention, a flip chip bonding land waving prevention pattern is configured such that a dummy pattern or a ground pattern is provided in an area of predetermined width in which the flip chip bonding lands exist, while a signal pattern in the area and the dummy pattern are separated from each other, in order to support all of flip chip bonding lands. Accordingly, there is no waving in the printed board, and bonding becomes sure.

Sixth Embodiment

A sixth embodiment of the present invention is a flip chip bonding land waving prevention pattern in which a dummy pattern or a ground pattern is provided in a position corresponding to flip chip bonding lands, while the dummy pattern is removed when a signal pattern exists in the position, to support all of flip chip bonding lands of a printed board in order to prevent the lands from waving.

Figure 9:
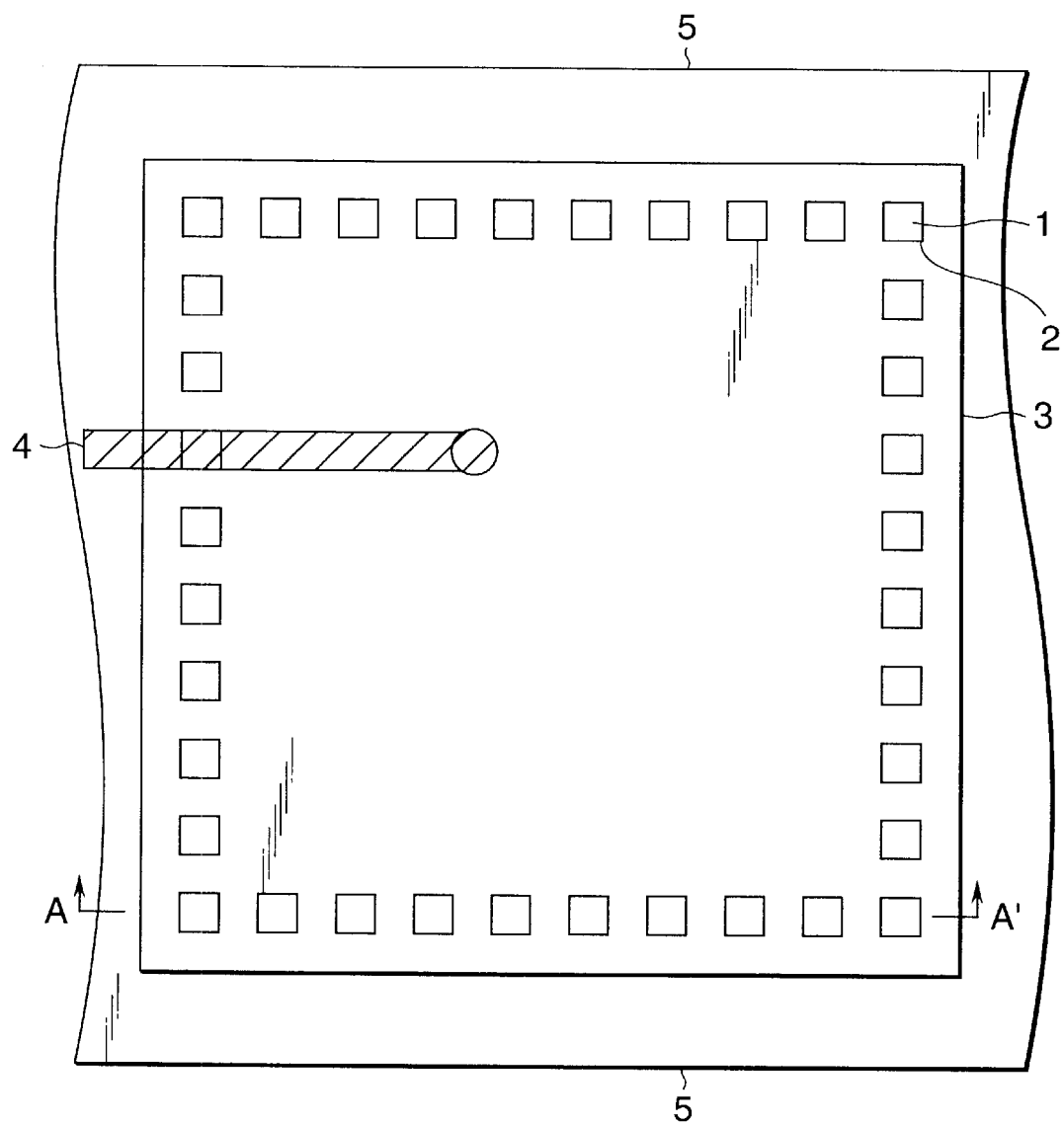
FIG. 9 is a plan view of a flip chip bonding land waving prevention pattern according to a sixth embodiment of the present invention.
Figure 10:
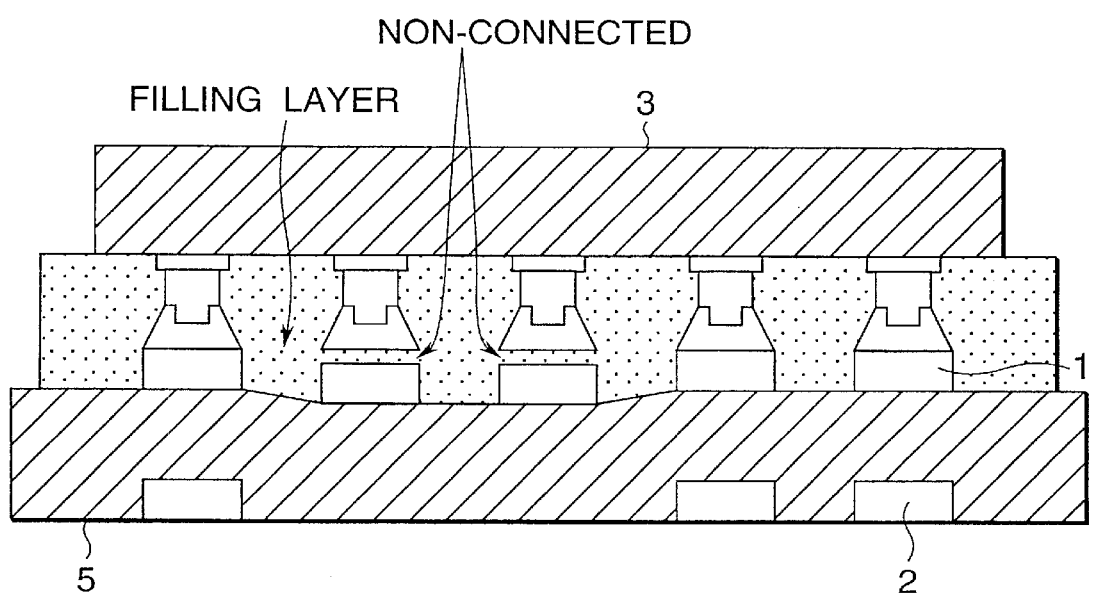
FIG. 10 is a sectional view of conventional flip chip bonding lands.

FIG. 9 is a plan view showing a configuration of a flip chip bonding land waving prevention pattern according to a sixth embodiment of the present invention. In FIG. 9, flip chip bonding lands 1 are lands for bonding a flip chip. In order to support these flip chip bonding lands 1, a dummy or ground pattern 2 is provided in the next layer.

FIG. 9 is a plan view showing a printed board 5 on which a flip chip 3 is bonded thereon. For the sake of convenience for explanation, the size of the flip chip 3 is shown by only a frame, and the dimensional relationship between the flip chip bonding lands 1 and the dummy or ground pattern 2 is shown by the schematic drawing. The size of the dummy pattern or ground pattern 2 is set such that the dummy or ground pattern 2 is provided within the rectangular area in which the flip chip bonding lands 1 are formed, and in the individual areas which make one-to-one correspondence to the flip chip bonding lands 1. Herein, the flip chip bonding lands 1 and the dummy or ground pattern 2 are illustrated on top of each other. That is, the dummy or ground pattern 2 having substantially the same size as the rectangular outer shape of the flip chip 3 is provided on the printed board 5. Accordingly, the flip chip bonding lands 1 keep a uniform plane, and there is no waving in the printed board. Accordingly, bonding is performed surely.

When the signal pattern 4 lies on the dummy pattern 2, the dummy pattern 2 is eliminated. Since the flip chip bonding lands 1 are supported by the signal pattern 4, the flip chip bonding lands 1 keep a uniform plane, and there is no waving in the printed board 5. Accordingly, bonding is performed surely.

As described above, according to the sixth embodiment of the present invention, a flip chip bonding land waving prevention is configured such that a dummy pattern or a ground pattern is provided in a position corresponding to the bonding lands of a flip chip, while the dummy pattern is removed when a signal pattern exists in the position, to support all of the flip chip bonding lands. Accordingly, there is no waving in the printed board, and bonding becomes sure.

As is apparent from the above-mentioned embodiments, according to the present invention, a flip chip bonding land waving prevention pattern is formed such that a dummy pattern or ground pattern or a signal pattern for supporting all of flip chip bonding lands of a printed board is provided on a layer next to the flip chip bonding lands so that the flip chip bonding lands are arranged substantially in a plane. Thus, the flip chip lands are supported by the dummy or ground pattern to prevent waving from occurring to thereby exhibit an effect of obtaining high bonding quality.

According to the present invention, a dummy pattern is not provided partially in a portion where bonding becomes instable but a dummy pattern or a ground pattern is provided in an area corresponding to the outer shape of a flip chip to thereby support all the bonding lands of the flip chip. Accordingly, there is an effect that the flip chip bonding lands are kept in a uniform plane to suppress waving of a multi-layer printed board so that bonding can be effected surely.

What is claimed is:

1. A flip chip bonding land waving prevention pattern, characterized in that a continuous pattern for supporting all of flip chip bonding lands of a printed board so as to arrange said lands in a plane is provided in an area corresponding to an outer shape of a flip chip on a layer next to said flip chip bonding lands.

2. A flip chip bonding land waving prevention pattern, characterized in that a continuous pattern for supporting all of flip chip bonding lands of a printed board so as to arrange said lands in a plane is provided in an area of predetermined width where said flip chip bonding lands exist said area corresponding to the outer shape of a flip chip and the inner shape of the flip chip bonding lands on a layer next to said flip chip bonding lands.

3. A flip chip bonding land waving prevention pattern, characterized in that a continuous pattern for supporting all of flip chip bonding lands of a printed board so as to arrange said lands in a plane is provided in an area corresponding to the outer shape of a flip chip on a layer next to said flip chip bonding lands, and in that a signal pattern in said area is separated from said continuous pattern by a shape in the form of an extension of a width between said flip chip bonding lands.

4. A flip chip bonding land waving prevention pattern, characterized in that a continuous pattern for supporting all of flip chip bonding lands of a printed board so as to arrange said lands in a plane is provided in an area of predetermined width where said flip chip bonding lands exist said area corresponding to the outer shape of a flip chip and the inner shape of the flip chip bonding lands on a layer next to said flip chip bonding lands, and in that a signal pattern in said area is separated from said continuous pattern by a width between said flip chip bonding lands.

5. A structure for mounting a flip chip having a first outer peripheral configuration, said structure comprising:

a printed circuit board;

a plurality of flip chip bonding lands arranged on said printed circuit board; and a waving prevention pattern embedded in said printed circuit board and located below said flip chip bonding lands, said waving prevention pattern defining a second outer peripheral configuration that is substantially identical or analogous to said first outer peripheral configuration, wherein said flip chip bonding lands define a third outer peripheral configuration substantially identical to said second outer peripheral configuration and a first inner peripheral configuration, and wherein said waving prevention pattern includes a single continuous pattern located entirely within an area circumscribed by said third outer peripheral configuration.

6. A structure for mounting a flip chip having a first outer peripheral configuration, said structure comprising:

a printed circuit board;

a plurality of flip chip bonding lands arranged on said printed circuit board; and a waving prevention pattern embedded in said printed circuit board and located below said flip chip bonding lands, said waving prevention pattern defining a second outer peripheral configuration that is substantially identical or analogous to said first outer peripheral configuration, wherein said flip chip bonding lands define a third outer peripheral configuration substantially identical to said second outer peripheral configuration and a first inner peripheral configuration, and wherein said waving prevention pattern includes a single continuous, annular pattern located entirely within an area between said third outer peripheral configuration and said first inner peripheral configuration.

7. A structure for mounting a flip chip having a first outer peripheral configuration, said structure comprising:

a printed circuit board;

a plurality of flip chip bonding lands arranged on said printed circuit board; and a waving prevention pattern embedded in said printed circuit board and located below said flip chip bonding lands, said waving prevention pattern defining a second outer peripheral configuration that is substantially identical or analogous to said first outer peripheral configuration and said waving prevention pattern includes a signal pattern, and a dummy or ground pattern separated from said signal pattern, wherein, said signal pattern is located below at least one of said flip chip bonding lands, and said dummy or ground pattern is located below the rest of said flip chip bonding lands, and wherein said dummy or ground pattern is substantially rectangular but notched along said signal pattern.

8. A structure for mounting a flip chip having a first outer peripheral configuration, said structure comprising:

a printed circuit board;

a plurality of flip chip bonding lands arranged on said printed circuit board; and a waving prevention pattern embedded in said printed circuit board and located below said flip chip bonding lands, said waving prevention pattern defining a second outer peripheral configuration that is substantially identical or analogous to said first outer peripheral configuration and said waving prevention pattern includes a signal pattern, and a dummy or ground pattern separated from said signal pattern, wherein, said signal pattern is located below at least one of said flip chip bonding lands, and said dummy or ground pattern is located below the rest of said flip chip bonding lands, and wherein said dummy or ground pattern is substantially annular but discontinuous at a location where said signal pattern exists.

* * * * *